United States Patent
Funke

(10) Patent No.: US 12,457,727 B2
(45) Date of Patent: Oct. 28, 2025

(54) HIGH DENSITY CARRIER TAPE

(71) Applicant: NEXPERIA B.V., Nijmegen (NL)

(72) Inventor: Hans-Juergen Funke, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 148 days.

(21) Appl. No.: 17/993,405

(22) Filed: Nov. 23, 2022

(65) Prior Publication Data
US 2023/0164968 A1  May 25, 2023

(30) Foreign Application Priority Data
Nov. 25, 2021 (EP) .................................... 21210392

(51) Int. Cl.
*H05K 13/04* (2006.01)
*C09J 7/35* (2018.01)
(Continued)

(52) U.S. Cl.
CPC ............ *H05K 13/0419* (2018.08); *C09J 7/35* (2018.01); *C09J 125/06* (2013.01); *C09J 169/00* (2013.01); *H05K 13/0408* (2013.01); *H05K 13/0812* (2018.08); *C09J 2203/326* (2013.01); *C09J 2301/304* (2020.08); *C09J 2301/416* (2020.08)

(58) Field of Classification Search
CPC ........... H05K 13/0419; H05K 13/0408; H05K 13/0812; H05K 13/0417; H05K 13/0084; C09J 7/35; C09J 125/06; C09J 169/00; C09J 2203/326; C09J 2301/304; C09J 2301/416; H01L 2221/68313; H01L 2221/68318; H01L 2221/68354; H01L 2221/68381; H01L 21/6836; B65D 73/02; B65G 47/06; B65G 47/90; B65G 47/91
See application file for complete search history.

(56) References Cited

U.S. PATENT DOCUMENTS

| 2008/0006922 A1 | 1/2008 | Gutentag |
| 2017/0162418 A1 | 6/2017 | Huang et al. |
| 2019/0067072 A1* | 2/2019 | Chang ..................... H01L 24/50 |

FOREIGN PATENT DOCUMENTS

EP    3107365 A1    12/2016

OTHER PUBLICATIONS

Extended European Search Report for corresponding European application EP21210392.3, 13 pages dated May 18, 2022.

* cited by examiner

*Primary Examiner* — Abbas Rashid
*Assistant Examiner* — Adrianna N Konves
(74) *Attorney, Agent, or Firm* — Ruggiero McAllister & McMahon LLC

(57) ABSTRACT

A carrier tape holding electrical components to a reel around which the carrier tape is wound is provided. Furthermore, the present disclosure is related to a pick-and-place apparatus for receiving this carrier tape and for picking and placing the electrical components arranged in the carrier tape. The carrier tape according to an aspect of the present disclosure includes an adhesive film that forms a bottom wall of the cavities in which a plurality of electrical components is arranged. The adhesive of the adhesive film is configured to substantially release the attachment of the electrical component as a result of heating the adhesive and/or as a result of irradiating the adhesive using light, such as visible light, infrared light, or ultraviolet light, for the purpose of allowing the electrical component to be removed from the cavity using a pick-and-place apparatus.

19 Claims, 4 Drawing Sheets

(51) Int. Cl.
*C09J 125/06* (2006.01)
*C09J 169/00* (2006.01)
*H05K 13/08* (2006.01)

HIGH DENSITY CARRIER TAPE

CROSS REFERENCE TO RELATED APPLICATION

This application claims the benefit under 35 U.S.C. § 119(a) of European Application No. 21210392.3 filed Nov. 25, 2021, the contents of which are incorporated by reference herein in their entirety.

BACKGROUND OF THE DISCLOSURE

1 Field of the Disclosure

Aspects of the present disclosure relate to a carrier tape holding electrical components and to an assembly comprising a reel and the carrier tape, wherein the carrier tape is wound around the reel. Furthermore, the present disclosure is related to a pick-and-place apparatus for receiving the carrier tape and for picking and placing the electrical components arranged in the carrier tape.

2. Description of the Related Art

Carrier tapes are known in the art. An example thereof is marketed under the name Surftape®. This known tape comprises an elongated carrier tape body comprising a plurality of cavities that are spaced apart along a longitudinal axis of the carrier tape body. The known tape further comprises an adhesive film covering a first side of the carrier tape body and forming a bottom wall of the cavities, wherein the adhesive film comprises an adhesive configured for attaching an electrical component to the bottom wall of a respective cavity among the plurality of cavities.

FIG. 1 illustrates a known pick-and-place apparatus 1000 that is configured for processing this known tape. It comprises a feeding unit 110 for receiving carrier tape 20 and for transporting carrier tape 20. It further comprises a releasing unit 1200 configured for substantially releasing the attachment of an electrical component 5 in a cavity of carrier tape 20, and a pick-and-place unit 130 for picking up a released electrical component 5 and for placing the picked electrical component 5 on a further electrical component such as a printed circuit board 140.

In FIG. 1, feeding unit 110 comprises a reel holder 111 on which a reel with carrier tape 20 is mounted, and a carrier tape guiding unit 112 configured to guide carrier tape 20 off the reel.

Pick-and-place apparatus 1000 further comprises a vision system 150 configured to identify an electrical component 5 in a given cavity of the carrier tape 20, and a controller 160 configured for controlling pick-and-place unit 130 based on an identified electrical component 5, and configured for controlling the releasing unit 1200 to release electrical component 5 in the given cavity.

Pick-and-place unit 130 comprises a pick-and-place unit controller 132 configured for controlling a robotic arm 131. Controller 132 is controlled by controller 160. Robotic arm 131 is provided, at an end thereof, with means for picking an electrical component 5 from a cavity of carrier tape 20, for example a suction nozzle 133.

Releasing unit 1200 comprises a pen that is brought into and out of engagement with carrier tape 20. When in engagement, the pen pushes against a backside of carrier tape 20. This causes carrier tape 20 to bulge as a result of which the electrical component 5 positioned in the cavity above the pen locally detaches from the adhesive film. This allows robotic arm 131 to pick up the electrical component 5 and to place it on printed circuit board 140.

A disadvantage of the known carrier tape is that it offers a relatively low density of electrical components. Here, the density should be construed as the number of electrical components per unit length of the carrier tape.

SUMMARY

At least some of the embodiments in accordance with a first aspect of the present disclosure provide a carrier tape in which the abovementioned problems do not occur or at least to a lesser extent.

According to an aspect of the present disclosure, a carrier tape is provided as defined in claim 1, wherein the adhesive is configured to substantially release the attachment of the electrical component as a result of heating the adhesive and/or as a result of irradiating the adhesive using light, such as visible light, infrared light, or ultraviolet light, for the purpose of allowing the electrical component to be removed from the cavity using a pick-and-place apparatus.

According to an aspect of the present disclosure, the attachment between electrical component and adhesive film is not broken using a needle but by changing the adhesive properties of the adhesive itself. In this way, a needle is no longer needed to partially detach the electrical component. This reduces the risk of damaging the electrical component and allows multiple electrical components to be arranged next to each other inside a single cavity. By using multiple electrical components, the density of electrical components in the carrier tape can be increased.

Preferably, a temperature at which the adhesive loses its adhesive properties is less than a melting temperature of the carrier tape body. For example, the temperature at which the adhesive loses its adhesive properties lies in a range between 120 and 170 degrees Celsius.

The carrier tape body may consist of one or more materials out of the group consisting of polycarbonate or polystyrene or a mixture thereof. This carrier tape body may have a thickness between 0.2 and 1.0 mm.

The adhesive film may comprise an adhesive film carrier on which the adhesive is arranged. Furthermore, the adhesive film carrier can be a continuous film carrier. Alternatively, the adhesive film carrier may comprise a plurality of disjoint patches. In both cases, the adhesive film carrier may consist of one or more materials out of the group consisting of polyolefin, polyvinyl chloride, polyethylene terephthalate, and polyimide. Such adhesive film carrier may have a thickness between 25 and 100 micrometers.

The carrier tape may further comprise a plurality of sprocket holes arranged spaced apart along the longitudinal axis of the carrier tape body. These sprocket holes can be engaged by the pick-and-place apparatus for the purpose of guiding and transporting the carrier tape.

The carrier tape may further comprise a first covering film arranged on a second side of the carrier tape body opposite to the first side. This first covering film can protect the adhesive film prior to using the carrier tape for holding a plurality of electrical components. Before arranging the electrical components in the cavities of the carrier tape, the first covering film needs to be removed.

Alternatively, the carrier tape may further comprise, for each cavity among the plurality of cavities, one or more electrical components arranged in that cavity. In this case, at least one cavity among the plurality of cavities may comprise a plurality of electrical components. This plurality of electrical components in the at least one cavity is preferably arranged in a matrix of rows and columns. The components arranged in the plurality of cavities can be identical. In addition, the same number of electrical components can be arranged in each of the cavities of the carrier tape. Furthermore, the carrier tape may further comprise a second covering layer arranged on a second side of the carrier tape body opposite to the first side, wherein the second covering layer forms a top wall of the cavities.

The electrical components arranged in the plurality of cavities can be electrical components out of the group consisting of bare semiconductor dies, packaged electrical components, chip scale packages, chip capacitors, and chip resistors, According to a second aspect of the present disclosure, an assembly is provided that comprises a reel and the above-mentioned carrier tape, wherein the carrier tape is wound around the reel.

According to a third aspect of the present disclosure, a pick-and-place apparatus is provided of which the releasing unit is configured for substantially releasing the attachment of the electrical component in a cavity of the carrier tape by heating the corresponding adhesive and/or by irradiating the adhesive using light, such as visible light, infrared light, or ultraviolet light.

In case the carrier tape comprises the abovementioned second covering layer, the pick-and-place apparatus is configured for removing this covering layer to allow the electrical components arranged in the cavities of the carrier tape to be picked.

The releasing unit may comprise a heater and/or an optical light source, such as a laser, wherein the releasing unit is arranged to face the carrier tape from the first side thereof.

The pick-and-place apparatus may further comprise a vision system configured to identify one or more electrical components in a given cavity of the carrier tape, and a controller configured for controlling the pick-and-place unit based on the identified one or more electrical components and configured for controlling the releasing unit to release the one or more electrical components in said given cavity. For example, the controller can be configured to control the releasing unit for releasing all electrical components in the given cavity before pick-and-placing these components. Alternatively, the controller can be configured to control the releasing unit for releasing one or some of the electrical components in the given cavity before pick-and-placing this component or these components. In a particular embodiment, an electrical component in a given cavity is first individually released and pick-and-placed, before a next electrical component in the same cavity is released.

The feeding unit can be configured for transporting the carrier tape relative to the releasing unit, wherein the controller is configured to control the feeding unit to transport the carrier tape such that alignment between a current cavity of the carrier tape and the releasing unit is broken and such that alignment between a next cavity of the carrier tape and the releasing unit is established after the controller has determined, using the vision system, that no electrical components are present in the current cavity.

The feeding unit may comprise a reel holder on which a reel with the carrier tape as described above can be arranged, and a carrier tape guiding unit configured to guide the carrier tape off the reel.

The pick-and-place unit may comprise a robotic arm, and a pick-and-place unit controller configured for controller the robotic arm and configured to be controlled by the controller. The robotic arm can be provided, at an end thereof, with means for picking an electrical component from a cavity of the carrier tape, for example a suction nozzle.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 2A:
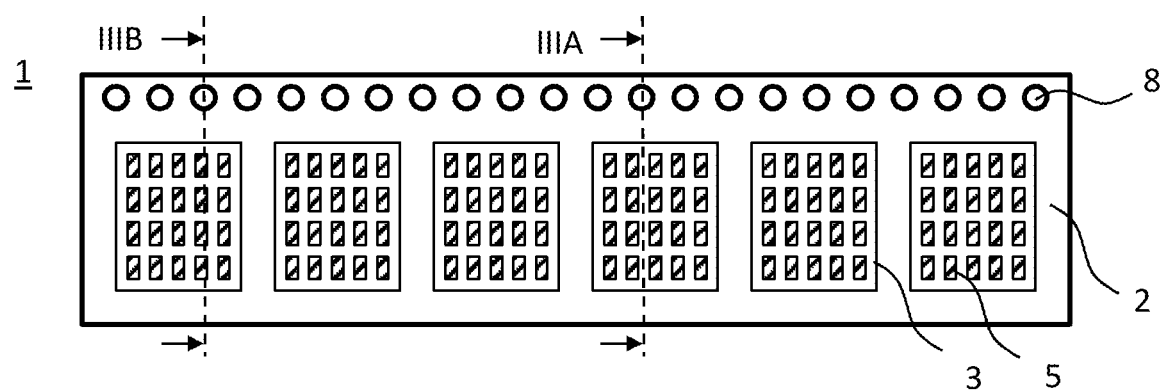
FIGS. 2A and 2B illustrate an embodiment of a carrier tape in accordance with an aspect of the present disclosure and a reel on which this carrier tape is wound.
Figure 2B:
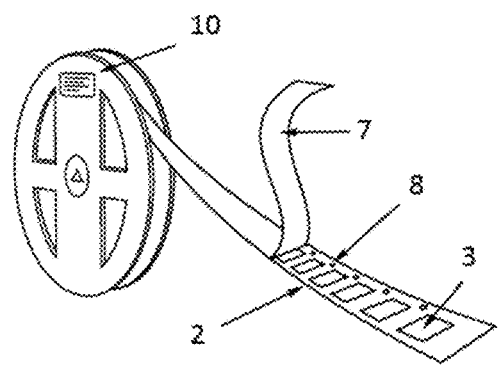
Figure 3A:
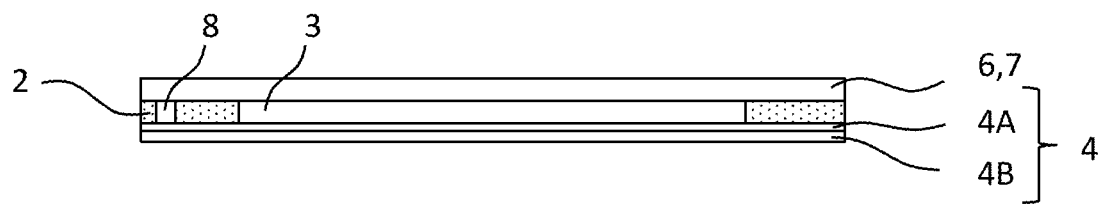
FIGS. 3A and 3B illustrate cross-sectional views of the carrier tape of FIG. 2A at two different positions.
Figure 3B:
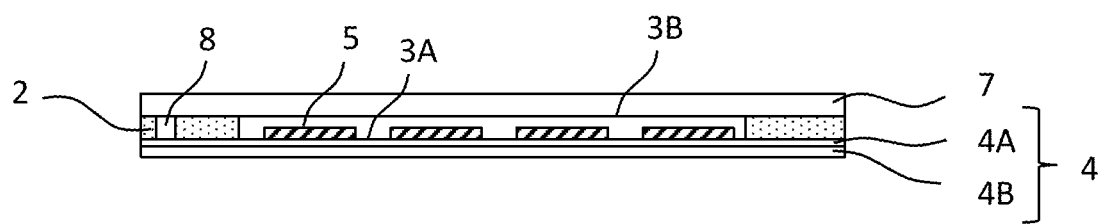

FIGS. 2A and 2B illustrate an embodiment of a carrier tape 1 in accordance with an aspect of the present disclosure and a reel 10 on which carrier tape 1 is wound, respectively. FIGS. 3A and 3B illustrate cross-sectional views of the carrier tape of FIG. 2A at two different positions. The position corresponding to FIG. 3A is indicated by line IIIA, and the position corresponding to FIG. 3B is indicated by line IIIB.

Now referring to FIGS. 3A and 3B, carrier tape 1 comprises a polycarbonate or polystyrene carrier tape body 2 having a thickness between 0.2 and 1.0 mm in which a plurality of cavities 3 is provided. An adhesive film 4 covers a first side of carrier tape body 2 and forms a bottom wall 3A of cavities 3. Adhesive film 4 comprises an adhesive film carrier 4B on which an adhesive 4A is arranged. Adhesive film carrier 4B may comprise polyolefin, polyvinyl chloride, polyethylene terephthalate, polyimide or a mixture thereof. Adhesive film carrier 4B generally has a thickness between 25 and 100 micrometer and can be a continuous film carrier or it may comprise a plurality of disjoint patches.

Adhesive 4A is configured for attaching an electrical component 5 to the bottom wall 3A of a respective cavity 3 among the plurality of cavities 3. Furthermore, adhesive 4A is configured to substantially release the attachment of an electrical component 5 as a result of heating the adhesive 4A and/or as a result of irradiating the adhesive 4A using light, such as visible light, infrared light, or ultraviolet light. This allows electrical component 5 to be removed from cavity 3 using a pick-and-place apparatus 100 as will be described in conjunction with FIG. 4.

A temperature at which adhesive 4A loses its adhesive properties is less than a melting temperature of carrier tape body 2. For example, the temperature at which adhesive 4A loses its adhesive properties lies in a range between 120 and 170 degrees Celsius.

Carrier tape 1 comprises a plurality of sprocket holes 7 arranged spaced apart along the longitudinal axis of carrier tape body 2.

In FIG. 3A it is shown that carrier tape 1 may comprise a second covering layer 7 arranged on a second side of carrier tape body 2 opposite to the first side. Second covering layer 7 forms a top wall 3B of cavities 3.

Prior to filling cavities 3 with components 5, carrier tape 1 may comprise a first covering film 6 arranged on a second side of carrier tape body 2 opposite to the first side. First covering film 6 protects adhesive film 4 prior to using carrier tape 1. After removing first covering film 6, components 5 can be arranged inside cavities 3. After arranging components 5, second covering layer 7 may be arranged to close off cavities 3. First covering film 6 and/or second covering film 7 generally do not cover sprocket holes 8.

According to the present disclosure, each cavity 3 can be filled with a plurality of electrical components 5, which can be arranged in a matrix of rows and columns. Moreover, the components can be identical.

Electrical components 5 can be components out of the group consisting of bare semiconductor dies, packaged electrical components, chip scale packages, chip capacitors, and chip resistors.

Figure 1:
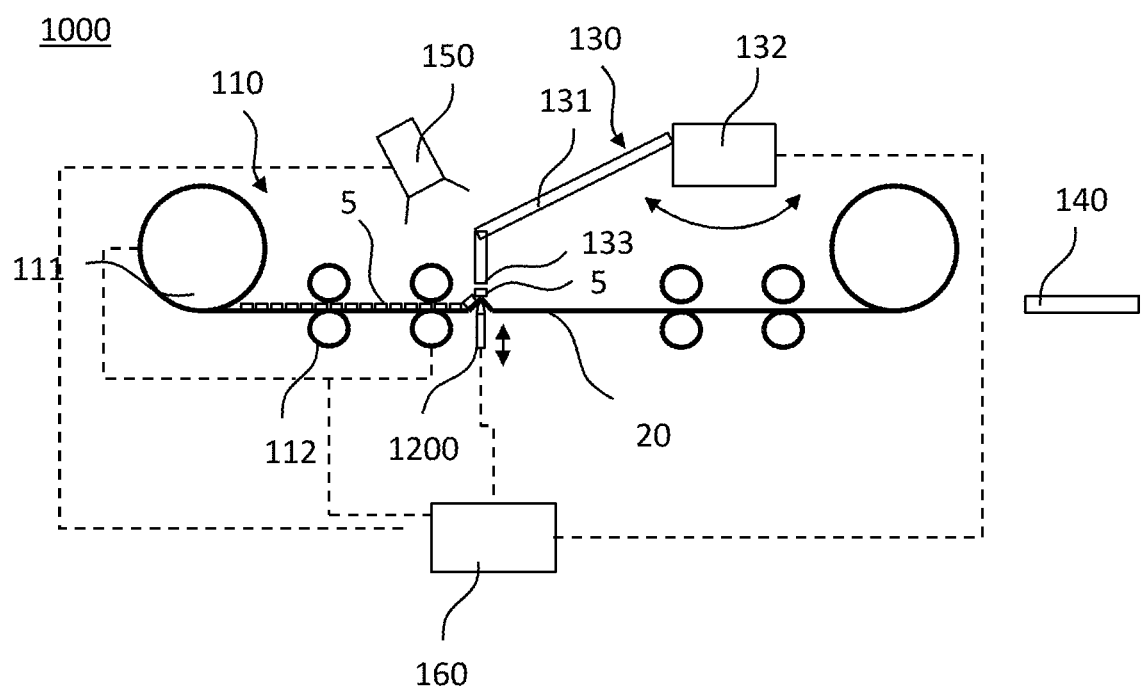
FIG. 1 illustrates a known pick-and-place apparatus handling a known carrier tape.
Figure 4:
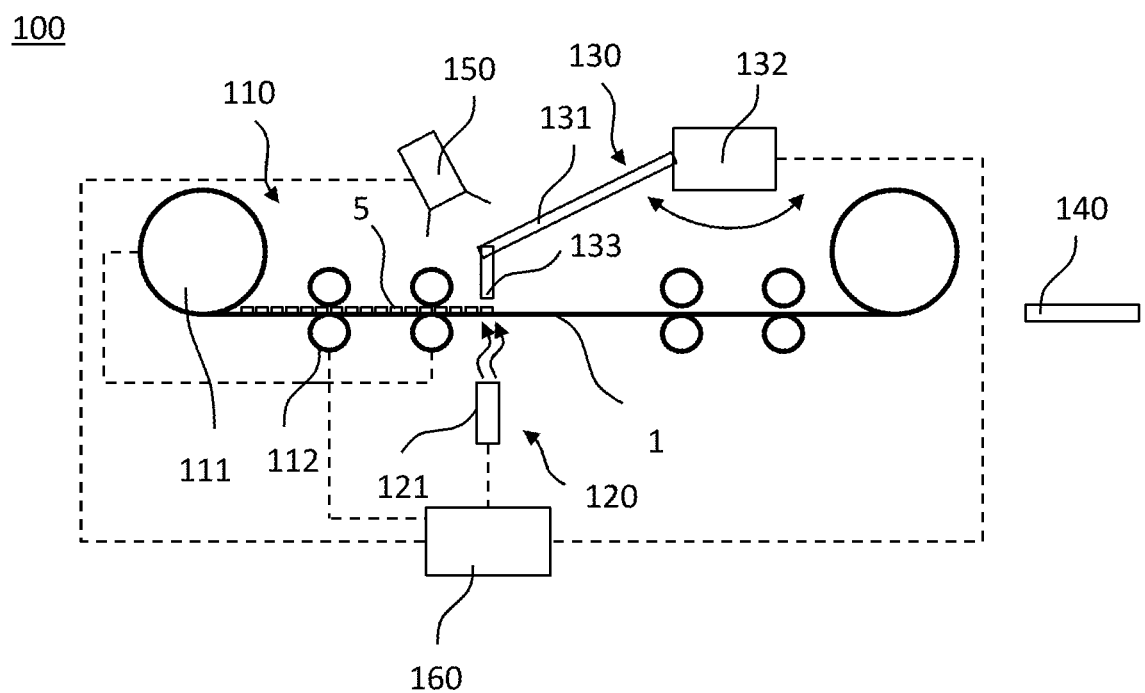
FIG. 4 illustrates an embodiment of a pick-and-place apparatus configured for handling the carrier tape of FIG. 2A.

FIG. 4 illustrates a pick-and-place apparatus 100 configured for handling carrier tape 1 of FIG. 2A. Several components of pick-and-place apparatus 100 are similar or identical to the components of pick-and-place apparatus 1000 shown in FIG. 1. These components are referred to using the same reference signs.

Releasing unit 120 of pick-and-place apparatus 100 is configured for substantially releasing the attachment of the electrical component 5 in a cavity 3 of carrier tape 1 by heating the corresponding adhesive 4A and/or by irradiating adhesive 4A using light, such as visible light, infrared light, or ultraviolet light. For example, as shown in FIG. 4, releasing unit 120 comprises an optical light source, such as a laser 121. Moreover, releasing unit 120 is arranged to face carrier tape 1 from the first side thereof.

Pick-and-place apparatus 100 further comprises a vision system 150 configured to identify one or more electrical components 5 in a given cavity 3 of carrier tape 1. Controller 160 is configured for controlling pick-and-place unit 130 based on the identified one or more electrical components 5 and configured for controlling releasing unit 120 to release the one or more electrical components 5 in said given cavity 3. In an embodiment, controller 160 is configured to control releasing unit 120 for releasing all electrical components 5 in said given cavity 3 before pick-and-placing these components 5. In another embodiment, controller 160 is configured to control releasing unit 120 for releasing one or some of the electrical components 5 in said given cavity 3 before pick-and-placing this component 5 or these components 5. In particular embodiment, a single component 5 is released each time, which is subsequently pick and placed before releasing a next component 5.

For releasing components 5, light from laser 121 may be directed to those components 5. For example, releasing unit 120 may comprise a mirror, such as a MEMS mirror, for directing laser light from laser 121 towards the position of a component to be released next. This position can be determined using image data collected by vision system/camera 150. This same camera can be used to verify that a given component has been picked, and/or to determine that no more components 5 are present in a cavity 3. After controller 160 has determined that this latter case applies, it will control carrier tape guiding unit 121 to transport carrier tape 1 to move to a next cavity 3. More in particular, a next cavity 3 will be brought into alignment with releasing unit 120 and pick-and-place unit 130.

It should be noted that the present application does not exclude other means to bring carrier tape 1 and releasing unit 120 in alignment. For example, laser 121 can be configured to move as a whole instead of or in addition to using a mirror to direct the laser light.

In the above, the present disclosure has been described using detailed embodiments thereof. However, the present disclosure is not limited to these embodiments. Instead, various modifications are possible without departing from the scope of the present disclosure which is defined by the appended claims and their equivalents.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalization thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A carrier tape, comprising:
an elongated carrier tape body comprising a plurality of cavities that are spaced apart along a longitudinal axis of the carrier tape body; and
an adhesive film covering a first side of the carrier tape body and forming a bottom wall of the cavities;
wherein the adhesive film comprises an adhesive configured for attaching an electrical component to the bottom wall of a respective cavity among the plurality of cavities;
wherein the adhesive is configured to substantially release the attachment of the electrical component as a result of heating the adhesive and/or as a result of irradiating the adhesive using light to allow the electrical component to be removed from the cavity using a pick-and-place apparatus; and
wherein at least one cavity among the plurality of cavities comprises a plurality of electrical components, wherein the plurality of electrical components in the at least one cavity are arranged in a matrix of rows and columns having at least 3 of the rows and/or at least three of the columns.

2. The carrier tape of claim 1, wherein the adhesive loses its adhesive properties at a temperature that is less than a melting temperature of the carrier tape body, and wherein the temperature at which the adhesive loses its adhesive properties lies in a range between 120 and 170 degrees Celsius.

3. The carrier tape of claim 1, wherein the carrier tape body consists of one or more materials selected from the group consisting of polycarbonate, polystyrene, and a mixture thereof, and wherein the carrier tape body has a thickness between 0.2 and 1.0 mm.

4. The carrier tape of claim 1, wherein the adhesive film comprises an adhesive film carrier on which the adhesive is arranged, and wherein the adhesive film carrier is a continuous film carrier or comprises a plurality of disjoint patches.

5. The carrier tape of claim 1, wherein the light is selected from the group consisting of visible light, infrared light, and ultraviolet light.

6. The carrier tape of claim 1, further comprising a plurality of sprocket holes arranged and spaced apart along the longitudinal axis of the carrier tape body.

7. The carrier tape of claim 1, further comprising a first covering film arranged on a second side of the carrier tape body opposite to the first side, and wherein the first covering film protects the adhesive film prior to using the carrier tape for holding a plurality of electrical components.

8. The carrier tape of claim 1, wherein the carrier tape further comprises a second covering layer arranged on a second side of the carrier tape body opposite to the first side, and wherein the second covering layer forms a top wall of the cavities.

9. The carrier tape of claim 4, wherein the adhesive film carrier consists of one or more materials selected from the group consisting of polyolefin, polyvinyl chloride, polyethylene terephthalate, polyimide, and a mixture thereof, and wherein the adhesive film carrier has a thickness between 25 and 100 micrometers.

10. The carrier tape of claim 8, wherein the electrical components are arranged in the plurality of cavities and are identical.

11. The carrier tape of claim 8, wherein the electrical components arranged in the plurality of cavities are electrical components selected from the group consisting of: bare semiconductor dies, packaged electrical components, chip scale packages, chip capacitors, chip resistors, and bare ceramic dies.

12. An assembly, comprising a reel and the carrier tape of claim 8, wherein the carrier tape is wound around the reel.

13. A pick-and-place apparatus configured to pick and place components from a carrier tape as defined in claim 8, comprising:
a feeding unit to receive the carrier tape and transport the carrier tape;
a releasing unit configured to substantially release the attachment of an electrical component in a cavity of the carrier tape; and
a pick-and-place unit to pick up the released electrical component and to place the picked electrical component on a further electrical component;
wherein the releasing unit comprises a heater and/or an optical light source, configured to release the component by heating the corresponding adhesive of the carrier tape and/or by irradiating the adhesive using light;
wherein the releasing unit is arranged to face the carrier tape from the first side thereof;
wherein the pick-and-place apparatus further comprises:
a vision system configured to identify one or more electrical components in a given cavity of the carrier tape;
a controller configured to control the pick-and-place unit based on the identified one or more electrical components, and configured to control the releasing unit to release the one or more electrical components in the given cavity; and
wherein the controller is configured to control the releasing unit to release all electrical components in the given cavity before pick-and-placing the electrical components, or wherein the controller is configured to control the releasing unit to release one or some of the electrical components in the given cavity before pick-and-placing the electrical components.

14. The pick-and-place apparatus according to claim 13, wherein the feeding unit is configured to transport the carrier tape relative to the releasing unit, wherein the controller is configured to control the feeding unit to transport the carrier tape so that alignment between a current cavity of the carrier tape and the releasing unit is broken and so that alignment between a next cavity of the carrier tape and the releasing unit is established after the controller has determined, using the vision system, and no electrical components are present in the current cavity.

15. The pick-and-place apparatus according to claim 13, wherein the feeding unit comprises:
an assembly comprising a reel and the carrier tape, wherein the carrier tape is wound around the reel;
a reel holder on which the assembly can be arranged; and
a carrier tape guiding unit configured to guide the carrier tape off the reel.

16. The pick-and-place apparatus according to claim 13, wherein the pick-and-place unit comprises:
a robotic arm; and
a pick-and-place unit controller configured to control the robotic arm and configured to be controlled by the controller;
wherein the robotic arm is provided, at an end thereof, to pick an electrical component from a cavity of the carrier tape.

17. The pick-and-place apparatus according to claim 13, wherein the further electrical component is a printed circuit board.

18. The pick-and-place apparatus according to claim 13, wherein the light is selected from the group consisting of visible light, infrared light, and ultraviolet light.

19. The pick-and-place apparatus according to claim 13, wherein the optical light source is a laser.

* * * * *